United States Patent [19]

Daniele et al.

[11] Patent Number: 5,412,599
[45] Date of Patent: May 2, 1995

[54] NULL CONSUMPTION, NONVOLATILE, PROGRAMMABLE SWITCH

[75] Inventors: Vincenzo Daniele, Brugherio; Mirella Benedetti, Vimercate; Nuccio Villa, Roncello, all of Italy

[73] Assignee: SGS-Thomson Microelectronics, s.r.l., Milan, Italy

[21] Appl. No.: 951,274

[22] Filed: Sep. 25, 1992

Related U.S. Application Data

[63] Continuation-in-part of Ser. No. 816,885, Dec. 31, 1991, Pat. No. 5,282,161.

[30] Foreign Application Priority Data

Sep. 26, 1991 [IT] Italy ............................. VA91A0035

[51] Int. Cl.⁶ .................... G11C 7/02; H03K 19/096
[52] U.S. Cl. .................... 365/185; 365/218; 326/49; 326/112
[58] Field of Search .................. 365/185, 218, 900; 307/450, 451

[56] References Cited

U.S. PATENT DOCUMENTS

| | | | |
|---|---|---|---|
| 4,532,439 | 7/1985 | Koike | 307/450 |
| 4,683,554 | 7/1987 | Lockwood et al. | 365/185 |
| 4,823,317 | 4/1989 | Brahmbhatt | 365/189 |
| 4,829,203 | 5/1989 | Ashmore, Jr. | 365/185 |
| 4,881,199 | 11/1989 | Kowalski | 365/185 X |
| 4,935,790 | 6/1990 | Cappelletti et al. | 357/23.5 |
| 5,016,217 | 5/1991 | Brahmbhatt | 365/185 |
| 5,028,810 | 7/1991 | Castro et al. | 365/185 |

FOREIGN PATENT DOCUMENTS

| | | | |
|---|---|---|---|
| 0204300 | 12/1986 | European Pat. Off. | |
| 62-298226 | 12/1987 | Japan | 307/451 |

*Primary Examiner*—Viet Q. Nguyen
*Assistant Examiner*—Son Dinh
*Attorney, Agent, or Firm*—Seed & Berry

[57] ABSTRACT

A null consumption CMOS switch which may be set by nonvolatile programming is formed by a pair of complementary transistors preferably having a common drain and a common gate. The common gate is coupled to the floating gate a programmable and erasable, nonvolatile memory cell. The common gate/floating gate coupling can be a unitary floating gate structure. The floating gate directly drives the ON or OFF states of the two complementary transistors. On an output node of the switch, represented by the common drain of the pair of transistors, a signal present on a source node of one or the other of the two complementary transistors is replicated. The state of charge of the floating gate, imposed by programming or erasing, may be such as to reach advantageously a potential higher than the supply voltage or lower than the ground potential of the circuit. Different embodiments, such as a polarity selection, a path selector, a TRISTATE selector, and a logic gate selector are described.

23 Claims, 9 Drawing Sheets

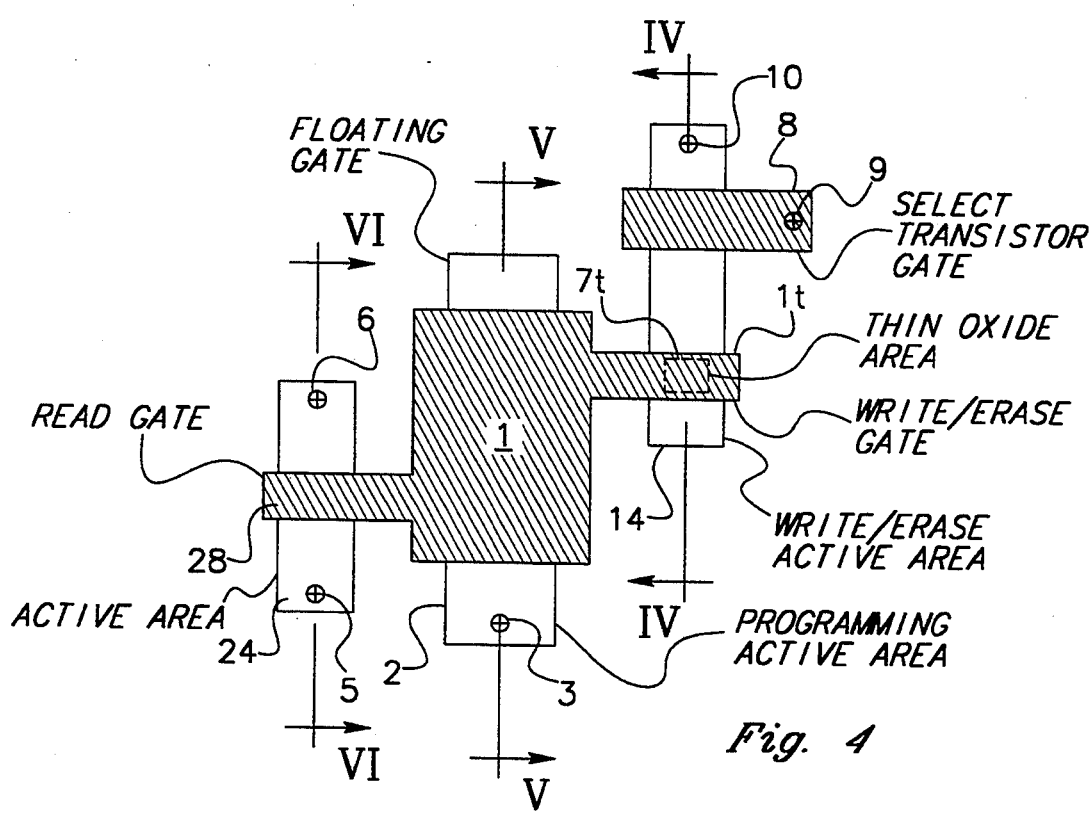
Fig. 4
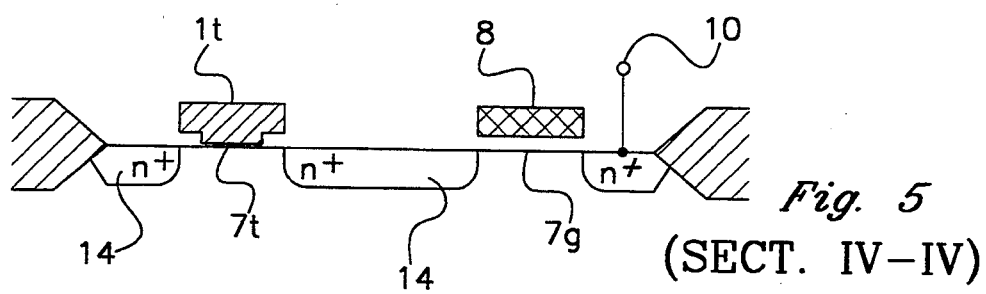
Fig. 5 (SECT. IV-IV)
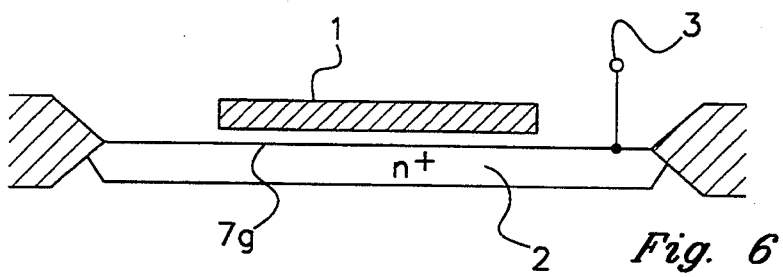
Fig. 6 (SECT. V-V)
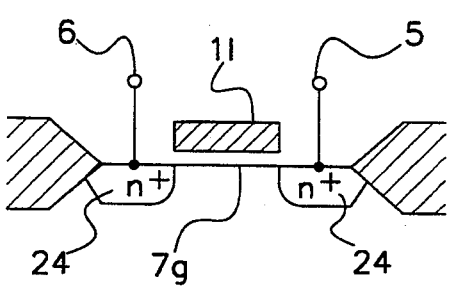
Fig. 7 (SECT. VI-VI)

NULL CONSUMPTION, NONVOLATILE, PROGRAMMABLE SWITCH

RELATED APPLICATION

The present application is a continuation-in-part application of U.S. patent application Ser. No. 07/816,885 entitled EEPROM CELL HAVING A READ INTERFACE ISOLATED FROM THE WRITE/ERASE INTERFACE, filed on Dec. 31, 1991, now U.S. Pat. No. 5,282,161.

TECHNICAL FIELD

The present invention also relates to switching devices, and more particularly, to null consumption, nonvolatile, programmable switches employing a memory cell.

BACKGROUND OF THE INVENTION

The structure of an EEPROM memory cell with a single level of gate conductor, which is frequently constituted by a polycrystalline silicon layer (single poly) though it may also be constituted by an aluminum or aluminum alloy layer, may be schematically depicted as the structure of a MOS transistor, commonly an n-channel, isolated-gate transistor, wherein the control terminal is capacitively coupled to the isolated gate. The isolated gate is fundamentally and physically contoured over two zones: a thin tunnel-oxide zone, through which the basic electrical phenomena of the writing and erasing mechanisms of the memory cell occur, and a relatively thicker oxide zone, over which the isolated gate acts as the gate of a "read" transistor for reading the state or the data stored in the memory cell.

This typical structure of the known art, is depicted schematically in FIGS. 1, 2 and 3. See, for example, U.S. Pat. No. 4,935,790 incorporated herein by reference. The isolated gate 1 lies over a programming first active area 2 of the semiconducting substrate in order to form a capacitive coupling zone between the same isolated gate 1 and a control terminal 3. The isolated gate 1 has a first projection 1t and a second projection 11, both extending over a second active area 4. In this second active area, the relative diffusions for creating a "read", n-channel, MOS transistor are formed, the drain terminal (contact) of which being indicated with 5 and the source region with 6 in the figure. Also in this second active area 4 the capacitive coupling between the isolated gate structure with a zone 7 of the semiconducting substrate which is covered with a thin, dielectric, tunneling layer, essentially thinner than the dielectric gate layer which is present over the rest of the area 4, is realized. Moreover, as shown in FIGS. 1 and 2, within the same second active area 4, an n-channel select transistor is also commonly formed, the gate of which is indicated with 8 and the relative control terminal with 9 (FIG. 1 ) and whose source terminal is indicated with 10.

The fact that the gate 11 of the "read" transistor is formed on the same active area 4 over which the writing/erasing gate 1t is also formed, creates precise limitations and non-negligible drawbacks. In these known cells, relatively low voltages must be maintained across the "read" gate of the cell, i.e., between the source and the drain regions (6 and 5) of the read transistor of the cell, in order to prevent an unintentional modification of the programmed or erased state of the memory cell. In fact, by being the read transistor's gate 11 formed within the same active area 4 of the write/erase tunneling zone 7, any voltage across these regions is replicated in the write/erase gate zone and this voltage determines an electric field across the tunneling thin dielectric layer 7 given by:

$$\frac{V_{isolated\ gate} - V_{drain\ of\ the\ write\ gate}}{\text{thickness of the tunnel dielectric}} = \frac{V(1) - V(6)}{\text{thickness}(7)}$$

If not appropriately limited, this electric field may determine a reverse voltage value sufficient to program an erased cell or to erase a programmed cell, thus causing erroneous responses of the memory device.

These restraints on the voltage levels which may be safely used in reading the data stored in the memory cell, i.e., of the voltage levels which may be used at the interface of the memory cell toward the external circuitry, disadvantageously limit the use of the memory cell as a modular element capable of being coupled directly with other CMOS structures of the circuitry outside the memory section of the integrated circuit. On the contrary, this makes necessary to operate with relatively small amplitude signals and to add signal level regenerating stages "downstream" of the EEPROM cells, thus increasing the signal propagation times and the power consumption of the integrated circuit.

The most widely diffused families of integrated logic devices (74HC . . . FAST, ACL, . . . , etc.) offer altogether a wide range of products, many of which differ among each other only in respect to some specific functions, such as for example output/output, enable/enable, CMOSTTL input levels, tristateno-tristate, input pull-up/no pull-up, and the like. Commercially available devices are divided, in terms of compatibility among each other, into "families" (as the above noted ones) which could be replaced by a more limited number of standard devices if, after having implemented on the same chip several different circuit configurations, an end user could select by programming a certain desired configuration from the many available.

So far such an approach has been considered unapplicable because it would require a certain number of additional pins for driving a selection circuitry and therefore a pin configuration different from the standard configuration commonly used in these integrated circuits.

A different type of problem is encountered in socalled PLD (Programmable Logic Devices) wherein the logic circuitry is configured by selecting the inputs to be connected to the AND and/or OR levels or the electrical paths within an output macrocell. In these devices, the control signals are generated by relatively sophisticated level-regeneration systems or by senseamplifiers capable of discriminating the state of programmable memory cells of a RAM, EPROM, EEPROM, FLASH EPROM and the like.

SUMMARY OF THE INVENTION

In both these different contexts, there is a need for a circuit structure which, in the first of said contexts will permit a selection between a number of possible different configurations of the integrated circuit without the need for dedicated selection pins and, in the second context, to generate in a simpler manner the configuring control signals, without increasing power dissipation.

This two-fold objective is attained by the present invention by use of an integrated CMOS switch capable of acting as a selector of either a logic signal path in one type of application or a certain function in a second type of application. The switch utilizes as a control element a floating gate which is substantially shared with a programmable and erasable non-volatile memory cell, e.g., a FLASH-EPROM or an EEPROM cell or the like.

As a consequence, the state of the CMOS switch depends directly from the relative charge stored in the floating gate of the memory cell which is associated with the CMOS switch. The state of charge is easily alterable by the user of the integrated circuit simply by writing/erasing the memory cell and this state is retained also when the circuit is not powered. The device of the invention does not require any alteration of the pin configuration of the integrated device because the programming phase for configuring the integrated circuit precedes the operating phase of the configured integrated circuit and therefore it is possible to exploit the standardized pin configuration of the integrated circuit also for pre-configuring the functional circuit.

As an alternative, by adding external pin connections, it is possible to manage the programming of the configuration of the device by means of an application software capable of modifying, in real time and directly on card, functional/electrical characteristics of the integrated circuit, thus adapting them to the performance requirements of an user's program.

One EEPROM cell that can be used with the invention comprises an isolated gate structure which is formed by a first portion which extends over a first active area of a semiconducting substrate covered by a gate dielectric layer, and which is capacitively coupled to a selected control terminal of the cell. The isolated gate structure includes a second portion which extends over a second active area that is substantially isolated from the first active area. The second active area is covered with a tunneling dielectric layer which is thinner than the dielectric gate layer in a region underneath the second portion of the isolated gate. The isolated gate has at least a third portion which extends over a third active area that is substantially isolated from the first and the second active areas and which is covered with a dielectric gate layer and constitutes the gate of at least a first "read" transistor of the state of the memory cell.

Alternatively, the same isolated gate of the memory cell may have a further projection extending over a fourth active area having a type of conductivity complementary to the type of conductivity of the other three active areas mentioned before, in order to form a second "read" transistor of the state of the memory cell of a complementary type in respect to the first read transistor. With one of the read transistors being P-type and the other being N-type, one of the read transistors conducts from its source to its drain, while the other read transistor does not conduct from its source to its drain. This latter embodiment, as will be discussed later, can be employed as a switch of the present invention without needing further circuitry.

The different aspects and advantages of the invention will become evident through the following detailed description of some preferred embodiments of the invention and by reference to the drawings.

BRIEF DESCRIPTION OF THE DRAWINGS

FIG. 4 is a schematic plan view of the integrated structure of an EEPROM memory cell with a single level of gate conductor, made in accordance with the present invention;

FIG. 5 is a simplified cross sectional view of the structure of FIG. 4 on the sectional plane IV—IV;

FIG. 6 is a simplified cross sectional view of the integrated structure of FIG. 4, on the sectional plane V—V;

FIG. 7 is a simplified cross sectional view of the integrated structure of FIG. 4, on the sectional plane VI—VI:

DETAILED DESCRIPTION OF THE INVENTION

Figure 1:
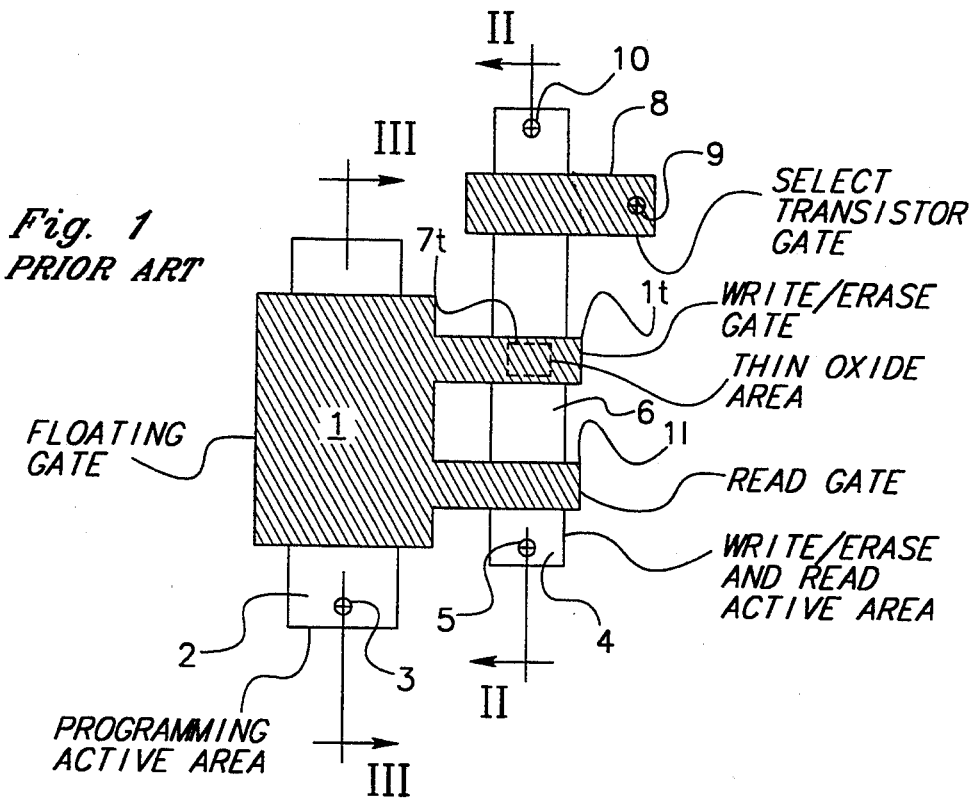
FIG. 1 is a schematic plan view of the structure of an EEPROM cell, according to the prior art.
Figure 2:
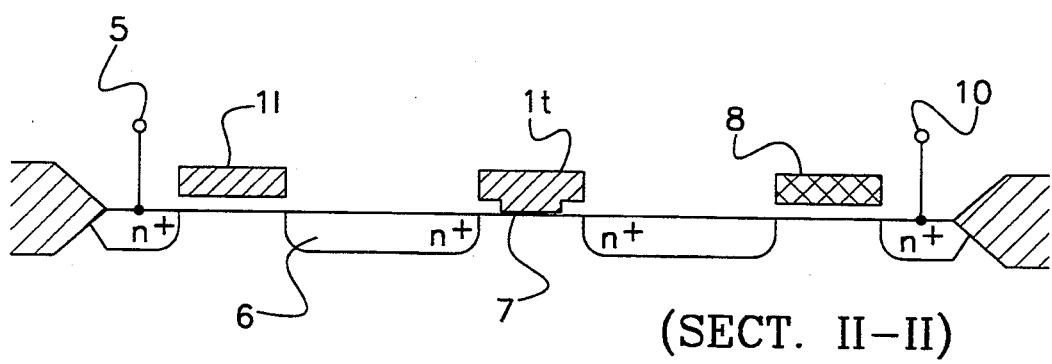
FIG. 2 is a simplified view in cross section of the structure of FIG. 1, on the section plane II—II.
Figure 3:
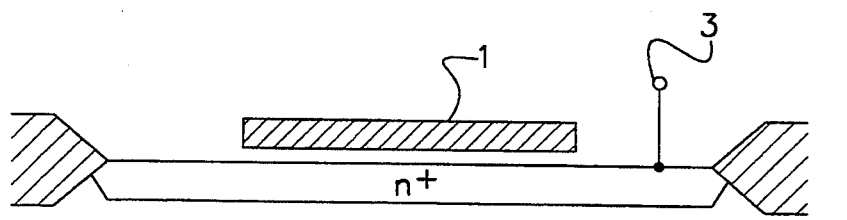
FIG. 3 is a simplified cross sectional view of the integrated structure of FIG. 1, on the section plane III—III.

With reference to FIGS. 4, 5, 6 and 7, the isolated gate 1 has a projection 28 constituting a so-called "read" gate of the memory device, which does not extend over the same active area 14, as was the case in the structure of an EEPROM cell of the prior art, but on the contrary the read gate 28 extends over a third active area 24, within which respective source and drain regions are formed in the underlying semiconducting substrate and which are contacted through the contacts 5 and 6, respectively of drain and source. (In the FIGS. 4, 5, 6, 7 and 8, which depict two alternative embodiments of the EEPROM cell of the invention, the same numbers already used in the preceding FIG. 1, 2 and 3 have been used for indicating similar or functionally equivalent parts of the integrated structures, with the purpose of facilitating a comparison among the different features of the cell of the invention and the features of a known cell, which has been already described in the preceding background section of the present specification.) The write/erase region, belonging to the active area 14, within which also the "select" transistor is formed in a manner similar to that of an EEPROM cell of the prior art, is distinctly separated from the region of the read transistor which is made within the active area 24 and the gate structure of which may be designed in a manner completely free of restraints which would be otherwise imposed by the programming circuitry which advantageously interfaces with the active area 14, and thus may function at voltage and current levels compatible with those of a normal CMOS external circuitry. In fact the capacitive coupling of the isolated gate 1 toward the external circuitry is dramatically reduced for what concerns the tunneling zone 7t where the thin dielectric layer 7 is present and where the previously mentioned problems may occur. The tunneling zone is within the active area 14, which represents the interface region with the programming circuitry of the memory cell.

The active area 24 represents instead the interface region between the cell and the external circuits and, in practice, is substantially isolated electrically toward the other programming circuitry interface region. In fact even though, through the gate structure of the read transistor, a capacitive coupling with the zone 7t of the write/erase thin dielectric layer exists through the same isolated gate 1, this coupling occurs through a dielectric layer having a thickness from three to four times greater then the thickness of the thin dielectric layer 7 which is present in the tunneling area 7t and therefore the electric field intensity is reduced by a similar factor for the same biasing voltage and may be neglected. In any case, the choice of the most suitable biasing voltage for the control terminal 3 remains possible in order to balance the coupling with the gate of the read transistor and thus preserve the electric state of the memory cell, during a reading phase.

One particularly advantageous aspect of the structure of the EEPROM memory cell of the present invention is represented by the possibility of differentiating the electrical characteristics of the read transistor of the cell according to need, as well as by the possibility of realizing more than one read transistor, each having electrical characteristics different from the others. Among these alternative embodiments, a particularly preferred embodiment is the one shown in FIG. 8. According to this embodiment, the isolated gate I is provided with another projection 30 extending over a fourth active area 12 which has been provided with a conductivity of opposite type in respect to the type of conductivity of the active area 24. By forming the respective source and drain diffusions, two distinct and complementary read transistors of the memory cell are formed one with an n-channel and the other with a p-channel. By connecting the respective terminals of the pair of complementary transistors in the manner shown in FIG. 8, a "read interface" toward the external circuitry is obtained, which is substantially configured as a CMOS inverter. This type of read interface lends itself to very convenient circuital applications, as will be described later.

Under more general terms, the EEPROM memory cell of the invention lends itself to an extraordinarily large number of applications, as will be evident to a skilled person.

APPLICATION 1

Figure 9:
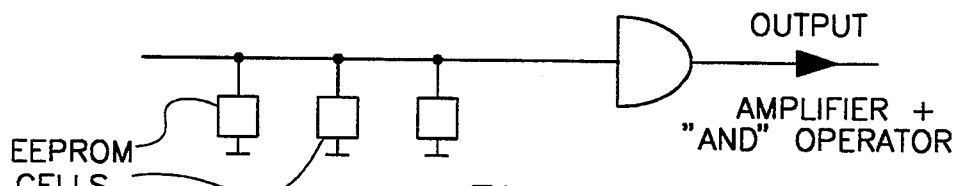
FIG. 9 is a functional block diagram of a logic circuit for generating a product term by employing EEPROM cells, according to a prior known technique.

A logic function which is often implemented in integrated devices is the generation of a product term by employing individually addressable and programmable EEPROM cells organized in an array of rows and columns and analog circuits (sense amplifiers) with the function of amplifying the weak read signals of the EEPROM cells which have an amplitude in the order of ten millivolts, coming from the array. These integrated architectures, though being quite compact from the point of view of silicon area occupation, denounce a large power consumption and a remarkable delay in the regeneration to CMOS logic levels of the read signals derived from the array of EEPROM cells. FIG. 9 shows a functional block diagram of such a circuit.

Figure 10:
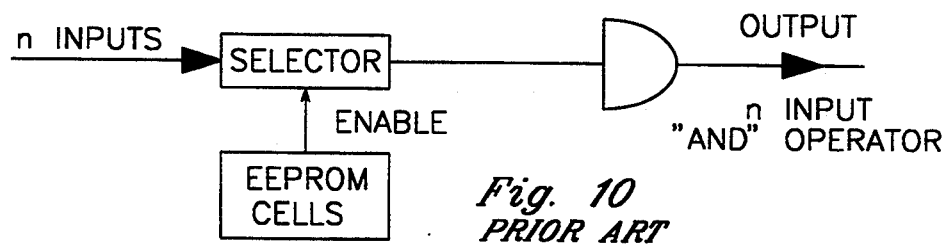
FIG. 10 is a block diagram of a logic circuit functionally equivalent to the circuit of FIG. 9, realized in CMOS technology, in accordance with the prior art.

In FIG. 10 is shown a block diagram relative to a sample implementation of the functions of the circuit of FIG. 9 in a CMOS type device. The parts which are pertinent to the function of enabling the selector may be generically made by employing conventional type EEPROM cells according to various circuital arrangements which are well known to a skilled technician, among which the most typical arrangement is a voltage divider using two EEPROM cells, as depicted in FIG. 11 which also contains the relative logic operation table.

Figure 11:
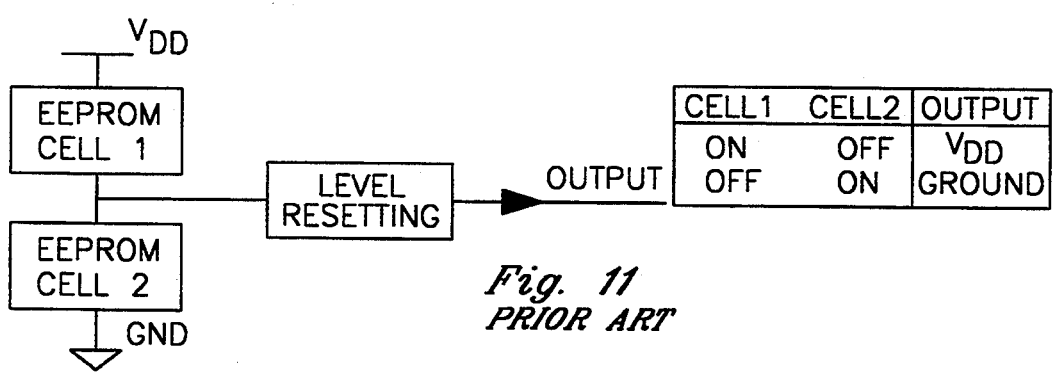
FIG. 11 is a partial block diagram of the enable circuit section of the functional diagram of FIG. 10, realized by using EEPROM cells having a conventional structure, in accordance with a known technique.

In a CMOS device, an embodiment of the type shown in FIG. 11, using two n-channel EEPROM cells, has the drawback of producing an output high level of a lower value than the supply voltage and more precisely lower by a threshold value then the voltage which is present on the isolated gate of the memory cell 1, i.e.:

$$V_{output} = V_{(gate\ of\ cell\ 1)} - V_{threshold}.$$

This voltage divider structure is extremely critical because the output signal may be degenerated and insufficient to drive CMOS circuits downstream. It is therefore necessary to add, downstream of the divider, a level regenerating stage in order to reduce this criticality. These restraints impose severe limits on programming quality and may cause a remarkable decrease of the fabrication yield. Moreover for each enable signal, two EEPROM cells and a relative level regenerating stage for the voltage signal are needed, i.e., in practice a "redundant" circuit stage as compared to strict functional needs.

Figure 8:
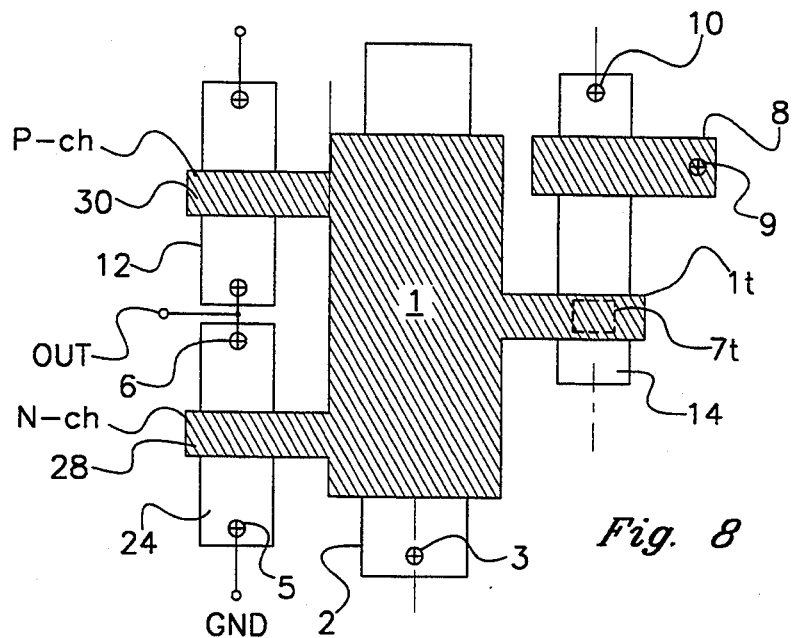
FIG. 8 is a schematic plan view of an alternative embodiment of the integrated structure of an EEPROM memory cell of the invention.

By employing a single EEPROM memory cell of the invention, of the type depicted in FIG. 8, the memory function and the auxiliary function of regenerating the voltage level of the logic signal may be implemented in a combined manner. In fact the OUT terminal of the EEPROM cell of the invention described in FIG. 8, may represent the output terminal of the functional scheme of FIG. 11, while the respective source terminal of the p-channel read transistor may be directly connected to the supply rail $V_{DD}$ and the source terminal 5 of the n-channel read transistor may be connected to ground (GDN).

By suitably dimensioning the CMOS inverter constituted by the pair of complementary read transistors of the EEPROM cell (naturally provided with two read gates: 28 and 30) the required functions are practically implemented.

Figure 12:
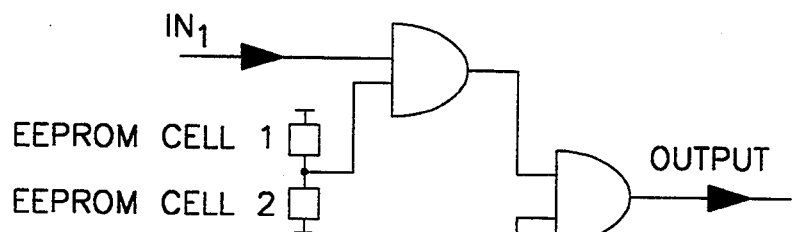
FIG. 12 is a further functional block diagram showing in greater detail the portion for the generation of the enable and selection signals for a single input of the circuit of FIG. 10.

FIG. 12 shows in greater detail the circuit portion for the generation of the enable and selection signals for a single input of the circuit of FIG. 10. Of course this structure is replicated as many times as the number of inputs.

Figure 13:
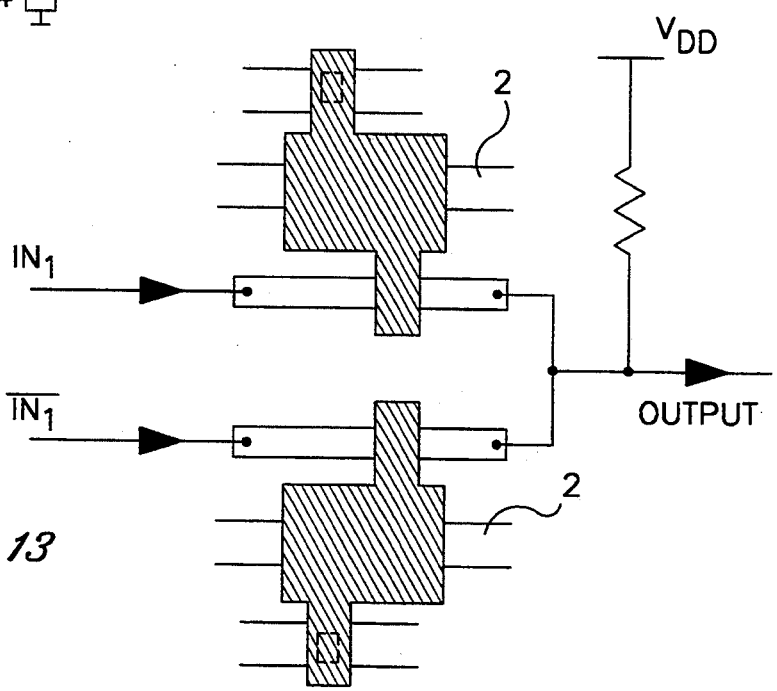
FIG. 13 is a circuit diagram, functionally equivalent to the circuit of FIG. 12, realized by using EEPROM cells made in accordance with the present invention, in the form depicted in FIG. 8.

The same functions are implemented by using only two EEPROM cells of the invention, of the type shown in FIG. 4, for driving through the respective output terminal (OUTPUT) of the memory cell a circuit which implements the logic AND operator, according to the diagram shown in FIG. 13.

By using the EEPROM cells of the invention, a redundancy in the total number of cells may be eliminated (two cells instead of four), thus realizing a remarkable saving of occupied area (two transistors instead of twelve, as would be necessary according to the diagram of FIG. 12, as will be evident to a skilled technician) and there will be a propagation delay imputable to a single transmission gate instead of the sum of propagation delays of two logic AND gates.

APPLICATION 2

Figure 14:
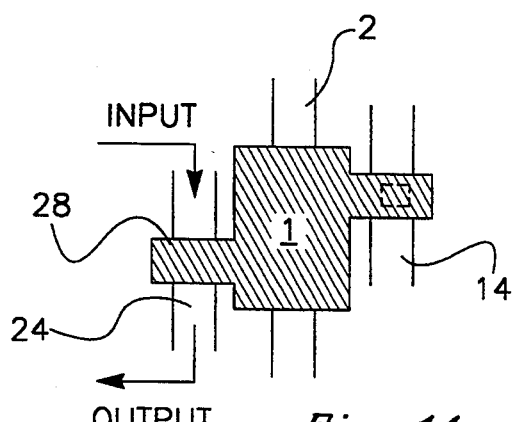
FIG. 14 is a functional, schematic plan view of the integrated structure of an EEPROM cell of the invention.
Figure 15:
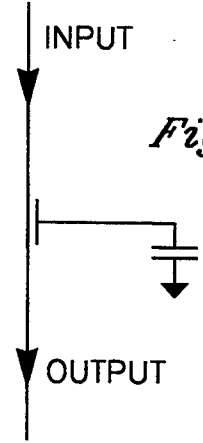
FIG. 15 represents an equivalent circuit diagram of the integrated structure of FIG. 14.
Figure 16:
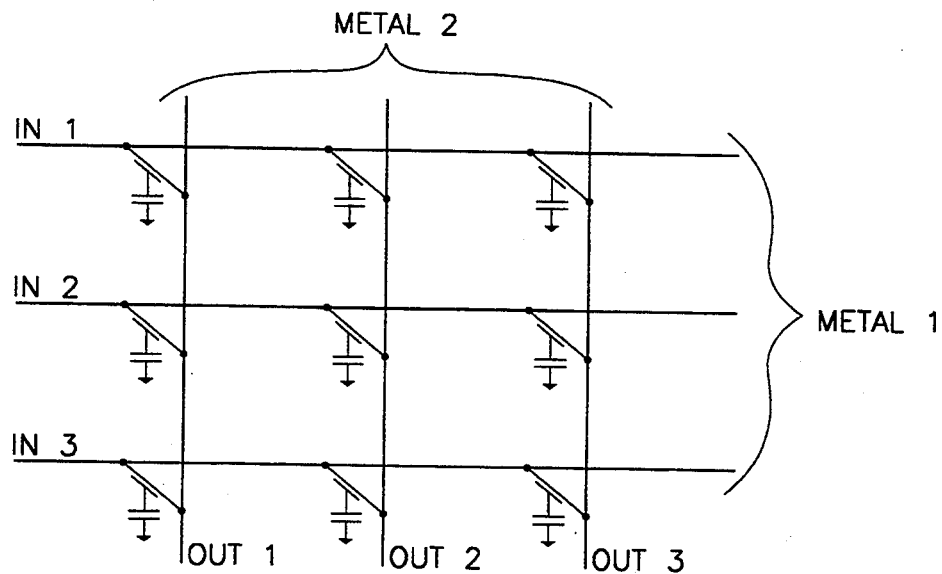
FIG. 16 is a schematic representation of the functional diagram of a multiplexing array, i.e., of a programmable interconnection array made with EEPROM cells of the present invention.

A single EEPROM cell made in accordance with the present invention may be functionally represented in a schematic way by the simplified integrated structure depicted in FIG. 14. To this structure corresponds the functional electric circuit shown in FIG. 15. The EEPROM cell of the invention is particularly suited to act as an EEPROM interconnecting element within complex programmable integrated devices. The cell is in fact capable of simultaneously perform a memory function and the function of a switch, the latter being perfectly suited to operate with voltage levels which are compatible with a standard CMOS circuitry. Therefore the EEPROM cell of the invention possesses an outstanding utility for implementing multiplexing structures or programmable interconnection arrays. A functional scheme of such an array of EEPROM cells of the invention is depicted in FIG. 16. A programmable interconnection array may be schemed in a first order of parallel conducting lines, patterned through a first level metal layer (metal 1), each corresponding to a respective input of the array and in a second order of parallel conducting lines, electrically isolated from the conducting lines of the first order, orthogonally arranged over the conducting lines of the first order, commonly patterned through a second level metal layer (metal 2), each corresponding to a respective output of the array. (Of course, metal 1 and/or metal 2 could be polycrystal layers in some embodiments.) At every crossing between a conducting line of the first order (input line) and a conducting line of the second order (output line) there is a programmable connection device, which is advantageously constituted by an EEPROM cell of the invention. The connection element is constituted by the read transistor of the state of the programmable memory cell, the source and drain terminals of which are respectively connected to a conducting line of the first order (to an input) and to a conducting line of the second order (to an output), or vice versa. As already described before, this read transistor of the EEPROM cell made in accordance with the present invention may advantageously be sized so as to withstand voltage and current levels which are compatible with the levels of a logic circuit external to the interconnection array, by being substantially isolated from the programming active area of the memory cell.

As a further alternative embodiment, the structure of FIGS. 4 or 14 could be modified to have two or more portions 28 of the gate layer 1 extend over the read active area 24 rather than just the single portion 28 shown in FIGS. 4 and 14. This would permit two or more read transistors to be formed and programmed from a single isolated gate structure 1.

Any of the above-described memory cells can be employed as part of an integrated CMOS switch made according to the present invention. However, the inventive switches are not intended to be limited to used with the above-described memory cells.

Figure 17:
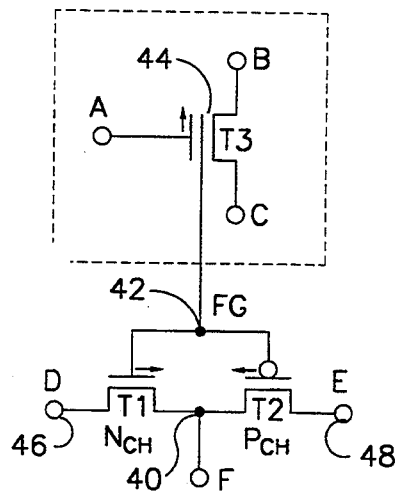
FIG. 17 is an electrical diagram of a CMOS switch of the present invention.

With reference to FIG. 17, the structure of an integrated CMOS switch made in accordance with the present invention is composed of a pair of complementary transistors T1 and T2 sharing a common drain(F) 40 and a common gate(FG) 42. This common gate FG, in turn, is essentially connected to the floating gate 44 of a FLASHEPROM or an EEPROM type memory cell T3, which is evidenced in the figure by a dash-line perimeter surrounding it. Preferably in the integrated structure, the two transistors and the memory cell share a physically unitary floating gate structure as shown in FIG. 8. Those skilled in the art will recognize that the memory cell of FIG. 8 is simply a specific monolithic embodiment of the general circuit shown in FIG. 17. The source 46 of the n-channel transistor T1 is functionally connected to a first node D having a first potential, e.g., to a Vdd supply rail, while the source 48 of the p-channel transistor T2 may be connected to a node E having a different potential, e.g., to a Vss rail, (e.g., to ground potential).

The transistors T1 and T2 need not be complementary in all embodiments. For example, the transistors can both be P-channel or N-channel, with an inverter positioned between the floating gate and one of the transistors. It is to be understood that the description of complementary transistors herein is intended to include all equivalent structures that allow one transistor to conduct while the other transistor does not.

The memory cell T3 may be a FLASH-type cell wherein programming takes place through injection of hot electrons from the channel region to the floating gate by applying a relatively high voltage (about 10 V) on the control gate terminal (A) and on the drain terminal (B) while the source terminal (C) is kept to ground potential (e.g., similarly to what happens in a UV-EPROM). Erasing of the programmed cell is achieved by transfer of electrons, through a mechanism known as the Fowler-Nordheim mechanism from the floating gate FG to the source (C), through a tunnel oxide. Conversely, in the case where the memory cell T3 is an EEPROM type cell, both writing (programming) and erasing operations take place by tunneling of electrical charge to and from the floating gate through a dedicated tunnel oxide area.

It should be noted that the voltage level which may be attained by the floating gate FG may reach relatively high positive values (even higher than the supply voltage Vcc of the integrated circuit) and negative values (below ground potential).

In a first state, e.g., with the floating gate at a voltage level corresponding to a logic "1"($V_{FG}=$"1"), only the n-channel transistor T1 is conducting (ON) and therefore the output node F takes the potential of the D node. In a second state, e.g., when $V_{FG}=$"0", the p-channel transistor T2 is conducting (ON), while the n-channel transistor T1 is switched-off (OFF) and therefore the potential of the E node becomes available on the output node F.

It is evident that this integrated structure has the following characteristics:

1) A null power consumption under static conditions due to the use of complementary (p-channel and n-channel) transistors, which cannot be conducting simultaneously.

2) Ability to drive the transistors T1 and T2 with a (floating) gate voltage more positive than the maximum supply voltage (e.g., >Vcc) and more negative than ground potential (e.g., <Vss). This permits to transfer to the output node F integer voltage values which are present on the D and E nodes, respectively, and therefore attain a null static consumption also through the logic gates which are eventually driven through the output node F of the circuit. Moreover this permits to lower the ON-resistance resistance of the transistors T1 and T2, thus making this switching structure particularly suited for fast circuits.

3) Direct exploitation of the potential of the floating gate of the FLASH or EEPROM memory cell as a logic control signal of the switch formed by the pair of complementary transistors T1 and T2, eliminates the necessity of placing an "interfacing" circuit between the memory element T3 and the controlled circuit, and allows the controlled circuit to be capable of acting as a "sensor" of the state of the memory element T3 and as a logic level regenerating stage, e.g., a sense amplifier.

4) The integrated structure behaves as a switch capable of selecting between a supply voltage and ground or between two different logic levels in a programmable and nonvolatile manner.

5) The inventive structure can be used to selectively determine the type of logic element present on a chip without the need to change any mask level. By changing the program state in the memory, the logic function provided can be selected to switch from one logic function to a different function. For example, the circuit may permit the logic function to be changed from a selected one within the following group to a selected different one within the following group, the group including inverters, pass through non-inverting logic, NAND gates, NOR gates, AND gates, OR gate, always high, always low, exclusive Or, or other logic function. A logic function NOR can easily be changed to an AND without the need to change any mask level. Other Demorgan transformation may also be made.

Figure 18:
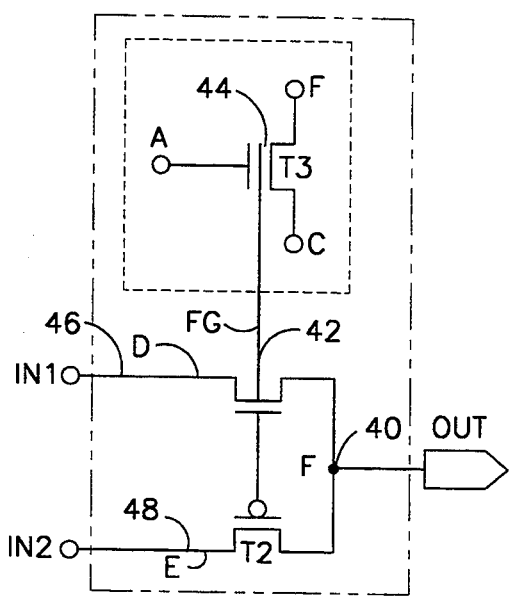
FIG. 18 is an electrical diagram of a path selector, realized by means of an integrated CMOS switch of the invention.

A path selector, made according to the present invention by utilizing an integrated CMOS switch similar to the one described in FIG. 17, is depicted in FIG. 18, wherein the above-described integrated switchs structure of FIG. 17, is evidenced by an encompassing perimeter, drawn with a dash-point line.

The operation of the path selector depicted is easily understood. If the floating gate FG has a negative charge, the state of the output node OUT is equal to the state of the input node IN2: ($V_{FG}=$"0" OUT=IN2). If the floating gate FG is positively charged, the state of the output is identical to the state of the input: ($V_{FG}=$"1" OUT=IN1).

Figure 19:
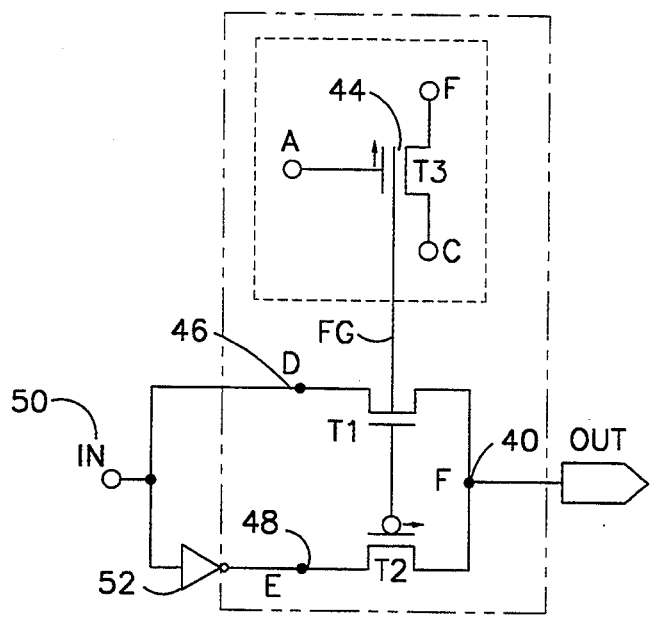
FIG. 19 is an electrical diagram of a polarity selector, realized by means of an integrated CMOS switch of the invention.

A polarity selector made according to the present invention by utilizing an integrated CMOS switch similar to the one shown in FIG. 17, is depicted in FIG. 19, wherein the structure of the integrated switch is evidenced by a perimeter drawn with a dash-point line.

The operation of the polarity selector depicted is of immediate comprehension. A single input(IN) 50 is directly coupled to the source of transistor T1 and indirectly coupled to the source of T2 through an inverter 52. If the floating gate FG is negatively charged, the state of the output is inverted as compared to the state of the input: ($V_{FG}=$"0" OUT=IN). If the floating gate FG is positively charged, the state of the output is equal to the state of the input: ($V_{FG}=1$" OUT=IN).

Figure 20:
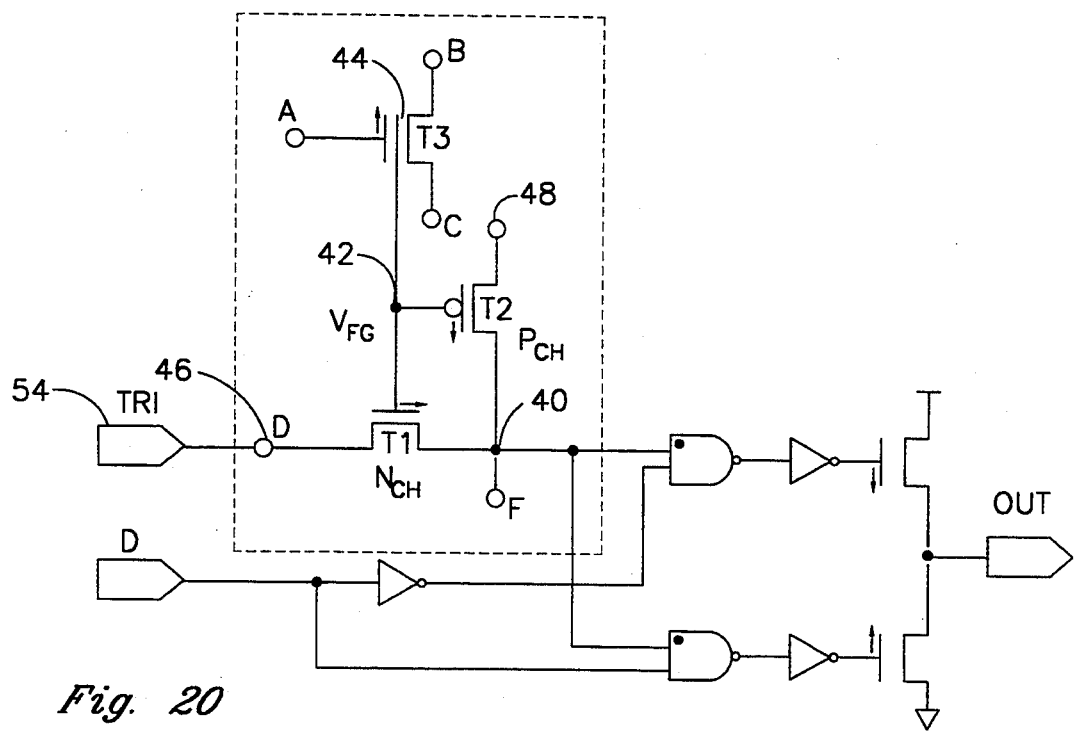
FIG. 20 shows a functional diagram of a tristate/no-tristate output type selector, realized by means of a CMOS switch of the invention.

An output type selector (e.g., tristate/notristate), made in accordance with the present invention by utilizing a switch similar to the one described in relation to FIG. 17, is shown in FIG. 20. Also in this case the switch's structure of the invention is put in evidence by a perimeter drawn with a dash line.

Notably, the circuit shown in FIG. 20 is used for activating or deactivating in a programmable manner a TRI signal 54 which permits enabling of a socalled "tristate" mode of operation of an output buffer of an integrated logic circuit. Also in this case the operation of the circuit is of immediate comprehension.

When the floating gate FG is negatively charged, the transistor T1 is OFF and therefore the TRI signal is blocked. Conversely, when the floating gate FG is positively charged, the transistor T1 conducts and therefore the TRI signal is enabled:

$V_{FG}=$"0" notristate buffer $V_{FG}=$"1" tristate buffer.

Figure 21:
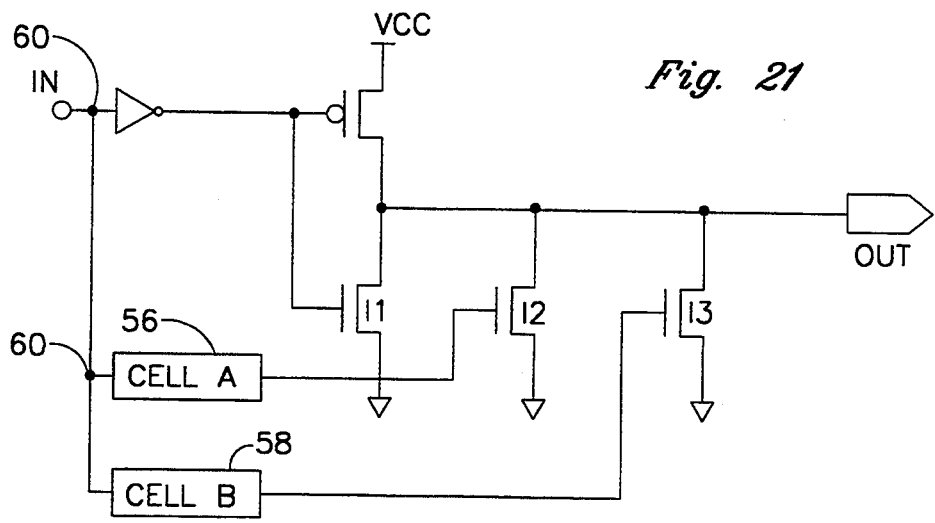
FIG. 21 shows a functional diagram of an output current selector for a buffer of an integrated logic circuit.

An output current (Iout) selector for an output buffer of an integrated logic circuit is schematically depicted in FIG. 21. The paths selection cells A and B utilized in the current selector circuit of FIG. 21 may conveniently be made in accordance with the present invention by utilizing a programmable integrated CMOS switch structure similar to the structure described in relation to FIG. 17.

Figure 22:
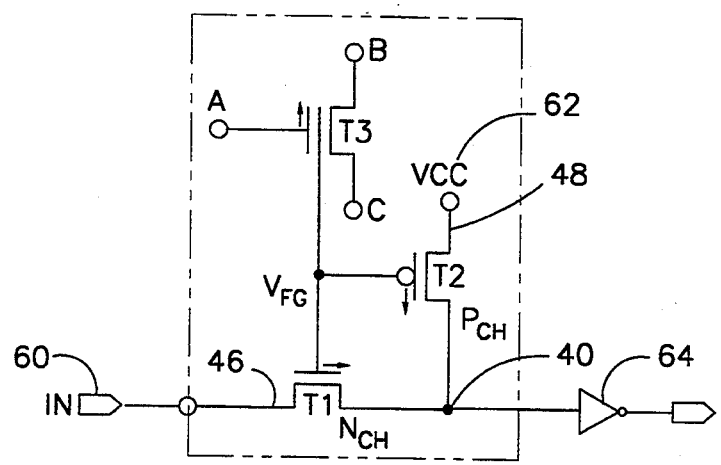
FIG. 22 shows an electrical diagram of a cell of the current selector of FIG. 21, implemented by means of an integrated CMOS switch of the invention.

According to a first embodiment, each of the cells A 56 and B 58 of the current selector circuit of FIG. 21 may be realized by utilizing a nonvolatile programmable switching structure of the invention, as depicted in FIG. 22, wherein the structure of the CMOS switch of FIG. 17 is evidenced by means of a perimeter drawn with a dash-point line. According to this first embodiment, on the input node 60 of an inverter of each cell, either an input signal IN 60 or the supply voltage Vcc 62 is transferred to an output node 40, thereby switching between a PASS-THROUGH gate and a DON'T CARE gate, respectively. An inverter 64 inverts the output to drive one of the n-channel current selectors I2 and I3.

Figure 23:
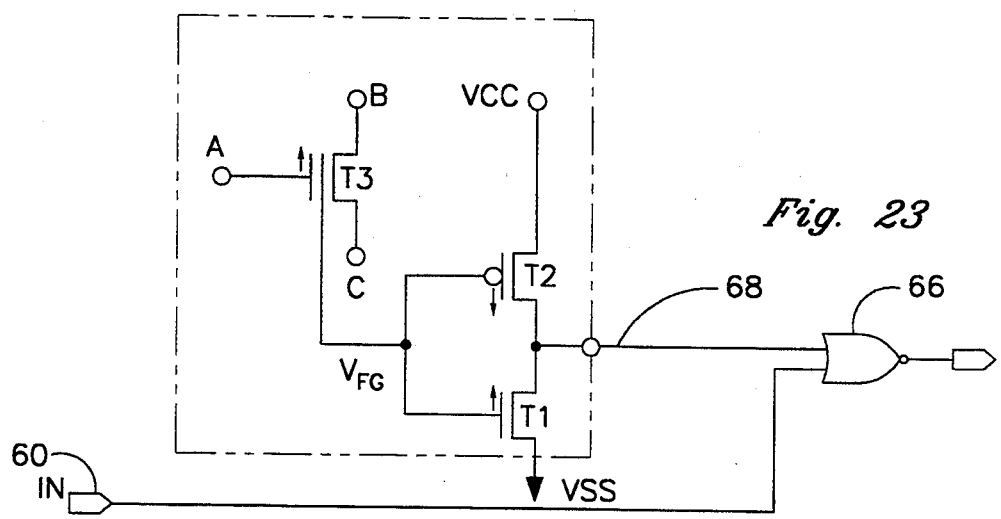
FIG. 23 shows an electrical diagram of a cell of the current selector of FIG. 21, implemented by means of an integrated CMOS switch made according to an alternative embodiment of the invention.

According to an alternative embodiment, each cell (A and B) of the current selector circuit of FIG. 21 may have a functional diagram as the one depicted in FIG. 23. According to this alternative embodiment, to an input node of a NOR circuit 66 a signal 68 may be transferred whose level may vary between a ground potential Vss and a supply voltage Vcc, and which will act, in a logical manner, as an enabling signal for the transfer of the signal IN which is fed to another input node of the NOR circuit. Of course the two solutions of FIGS. 6 and 7, though different, are logically equivalent to each other.

When the input signal IN="0", if the floating gates of the switching structure of the current selectors cells A and B are both negatively charged, the output current Iout will be equal to I1 (Iout=I1). If the floating gate of the A cell is positively charged and the floating gate of the B cell is negatively charged, then: Iout=I1+I2. If the floating gate of the A cell is negatively charged and the floating gate of the B cell is positively charged, then: Iout=I1+I3. If the floating gates of the A and B cells are both positively charged, the output current will be given by: Iout=I1+I2+I3.

Figure 24:
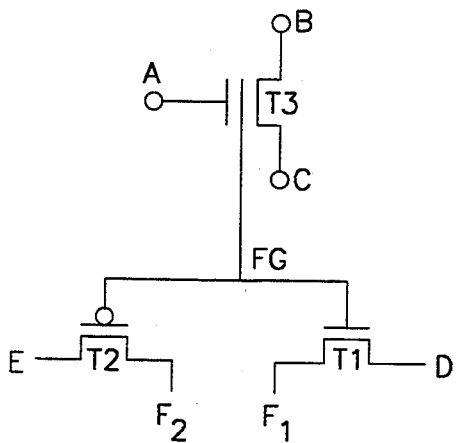
FIG. 24 is an electrical diagram of an alternate CMOS switch of the present invention.

Shown in FIG. 24 is an alternate embodiment of the invention that is identical to the embodiment of FIG. 17 except the drains of transistors T1 and T2 are not in common. By leaving the drains unconnected, the embodiment of FIG. 24 acts as a circuit selector. When the floating gate FG is high, a circuit including nodes D and F1 is connected. Likewise, when the floating gate FG is low, a circuit including nodes E and F2 is connected.

Figure 25:
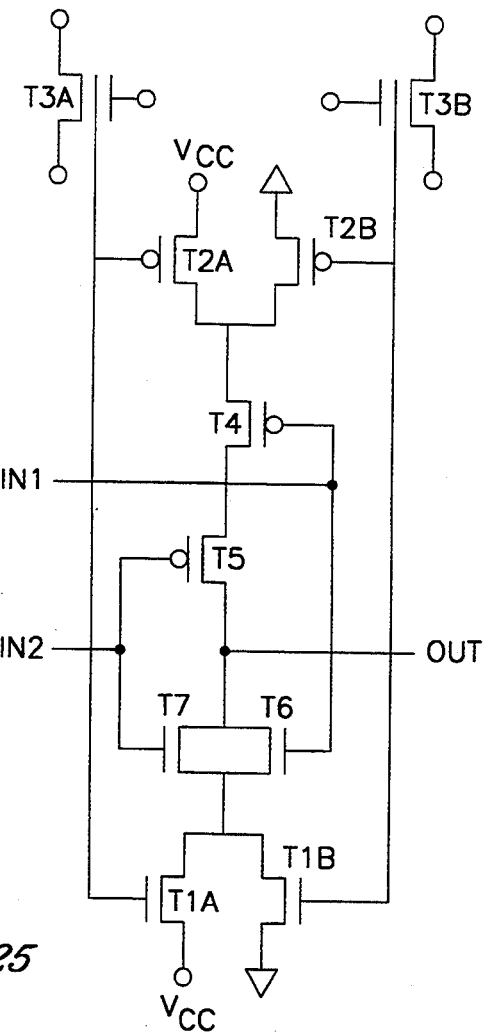
FIG. 25 is an electrical diagram of a programmable NOROR gate according to the present invention.

Shown in FIG. 25 is an example the inventive switches being employed in a logic circuit whose function alternates between a NOR and an OR function with changes in the states of the memory cells T3A and T3B. The logic circuit includes two switches, each of which is similar to the switch shown in FIG. 24. The first switch includes memory cell T3A and transistors T1A and T2A, while the second switch includes memory cell T3B and transistors T1B and T2B. The sources of T1A and T2A are provided with voltage signal Vcc, while the sources of T1B and T2B are grounded. The drains of T2A and T2B are coupled together and to the source of transistor T4. The drain of T4 is coupled to the source of a transistor T5. The drains of T1A and T1B are coupled together and to the sources of transistors T6 and T7. The gates of transistors T4 and T6 are coupled to an input IN1, while the gates of transistors T5 and T7 are coupled to an input IN2. The drains of transistors T5, T6, and T7 are coupled to and output OUT.

When the floating gates of memory cells T3A and T3B are programmed high and low, respectively, the circuit operates as an OR gate. The high signal from memory cell T3A enables N-channel transistor T1A so that its drain receives the high signal Vcc and passes it to the sources of transistors T6 and T7. Since the inputs IN1 and IN2 are coupled to the gates of N-channel transistors T6 and T7 respectively, the output OUT will be high if either or both of the inputs IN1 and IN2 are high.

To switch the circuit to a NOR gate, the floating gates of memory cells T3A and T3B are programmed low and high respectively. The low signal from memory cell T3A enables the P-channel transistor T2A so that its drain receives the high signal Vcc and passes it to the source of the transistor T4. The high signal from memory cell T3B enables N-channel transistor T1B so that its drain is driven low, which drives the sources of transistors T6 and T7 low. When either or both of inputs IN1 and IN2 are high, the N-channel transistors T6 and T7 will be enabled so that a low output OUT results. It is only when the inputs IN1 and IN2 are both low that transistors T4 and T5 are both enabled to pass the high signal at the source of T4 to the output OUT.

Those skilled in the art will recognize that a similar circuit to that shown in FIG. 25 will alternatively operate as an AND and a NAND gate. Such a circuit is made simply by switching the N-channel transistors and the P-channel transistors in FIG. 25. Using this modified circuit, a user can operate the circuit as a NAND gate by programming the floating gates of the memory cells T3A and T3B to be high and low, respectively. To switch to an AND gate, the user simply reprograms the memory cells T3A and T3B to be low and high, respectively. Similarly, circuits providing Demorgan transformations from AND to NOR and OR to NAND can be designed using the concepts of this invention.

These circuits illustrate the breakthrough in the art provided by the present invention. The programmable flexibility provided by the invention enables circuit designers to completely alter the logic operation of their circuits at any time without requiring additional pins for driving superfluous selection circuitry. Further, the simplicity of the invention allows both inexpensive manufacturing and incorporation into the very small spaces of an integrated circuit.

As will be appreciated, the connection from the floating gate of the memory cell to the control gates of transistors T1 and T2 can be made by a metal or poly interconnect. Also, the memory cell can be a OTP (one time programmable) ROM, UV-EPROM, EEPROM or other equivalent memory cell.

Those skilled in the art will recognize that the invention is not limited to integrated logic circuits. For example, the circuit of FIG. 22 can be used to alternatively pass through an input signal or block out the input signal. Instead of the input signal, the switch passes a voltage Vcc or another input second as shown in Figure 18. Such a function is a basic building block of circuit design, employable in countless circuits.

Figure 26:
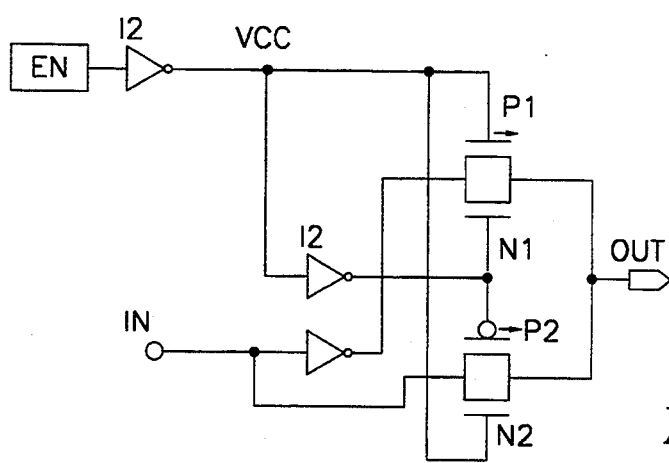
FIG. 26 is a functional diagram of a polarity selector for an integrated CMOS circuit made in accordance with the prior art.

A functional block diagram of a prior art type of polarity selector is depicted in FIG. 26. Commonly, in a case like this, it would be necessary to logically drive the $V_{CC}$ signal and therefore to use an additional EN pin and implement the relative driving logic circuitry (e.g., the inverters I1 and I2). Complementary pairs: N1, P1 and N2, P2 are normally used as switches for transferring to the output terminal OUT a full voltage level corresponding to the signal present on the input terminal IN. If the $V_{CC}$="0", the transistors T1 and N1 are conducting while the transistors P2 and N2 are off and therefore: OUT=IN. Vice versa, if $V_{CC}$="1", P1 and N1 are off while P2 and N2 are conducting and transfer to the output the input signal: OUT=IN.

Figure 27:
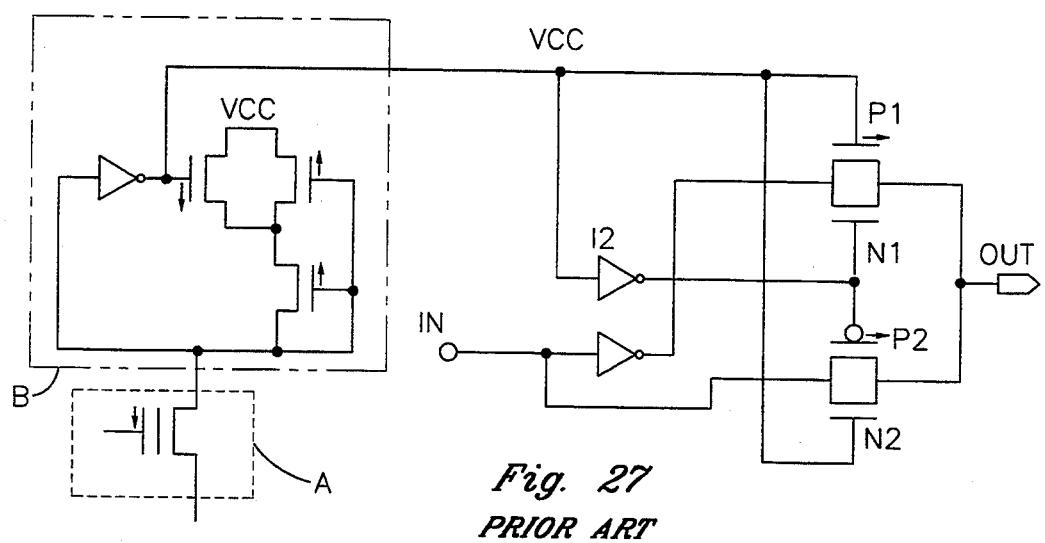
FIG. 27 is a functional diagram of a polarity selector for a PLD circuit utilizing a programmable control device, in accordance with the prior art.

As depicted in FIG. 27, in so-called PLD devices, additional driving pins are not necessary actually because the driving is implemented by utilizing a control signal made available by a sense amplifier which reads the state of a certain programmable memory cell. The relative circuit diagram is depicted in FIG. 27, wherein the A perimeter identifies a generic memory cell and the B perimeter identifies a sense amplifier for discriminating the stage of the addressed memory cell, in accordance to a known configuration.

Also in this type of application, the same function, which in accordance to the prior art is performed by the A cell and by the sense amplifier circuit B, may be more conveniently performed by an integrated CMOS switch made in accordance with the present invention, by utilizing a circuit as the one depicted in FIG. 19.

We claim:

1. A null consumption integrated switch settable by programming in a nonvolatile manner, which comprises
    a pair of complementary transistors having a common drain and a common gate, a source of a transistor of said pair being functionally connected to a first voltage node and a source of the other transistor of said pair being functionally connected to a different voltage node of the integrated switch;
    a programmable and erasable memory cell having a chargeable and dischargeable floating gate which is directly connected to said common gate of said transistors;
    the state of charge of said floating gate, imposed by programming or erasing said memory cell, determining one or the other state of an output node of the switch which coincides with the common drain of said transistors.

2. An integrated switch as defined in claim 1 wherein said programmable and erasable memory cell is a FLASH-EPROM cell.

3. An integrated switch as defined in claim 1 wherein said programmable and erasable memory cell is an EEPROM cell.

4. An integrated switch as defined in claim 1 wherein said complementary pair of transistors share a unitary floating gate structure with said programmable and erasable cell.

5. An integrated path selector comprising a circuit having two electrical paths, a complementary pair of transistors, constituting an interruption means of a respective electric path and having a gate, and a programmable and erasable memory cell controlling the transistors, wherein the gates of the transistors and a floating gate of the memory cell constitute a unitary gate member.

6. A path selector according to claim 5 wherein said common drain of said complementary pair of transistors is connected to the output terminal of the circuit, the source of a first transistor of said pair is connected to a first input terminal of the circuit and the source of the other transistor of said pair is connected to a second input terminal of the circuit.

7. An integrated polarity selector comprising a circuit implementing two electrical paths between an input and an output terminal of the circuit, each electrical path including a transistor that is complementary to the transistor in the other electrical path and wherein one of said electrical paths includes an inverter, wherein said complementary transistors have a common drain connected to one of said terminals of the circuit, and a common gate which forms a unitary gate member with a floating gate of an integrated programmable and erasable memory cell.

8. A polarity selector according to claim 7 wherein said common drain of said complementary pair of transistors is connected to the output terminal of the circuit, a source of a first transistor of said pair is connected to an input terminal of the circuit and a source of the other transistor of said pair is connected to an output of said inverter.

9. A programmable control switching device settable by programming in a nonvolatile manner, which comprises
    a pair of complementary transistors having a common gate, a source of a transistor of said pair being functionally connected to a first voltage node and a source of the other transistor of said pair being functionally connected to a different voltage node of the switching device;
    a programmable and erasable memory cell having a chargeable and dischargeable floating gate which is directly connected to said common gate of said transistors;
    the state of charge of said floating gate, imposed by programming or erasing said memory cell, determining one or the other state of an output node of the switch which coincides with the common drain of said transistors.

10. The integrated switch according to claim 9, wherein the first transistor is of N-channel, the second transistor is of P-channel, and the control node is directly coupled to the gate of each of the transistors.

11. The programmable control switching device of claim 10 wherein the first and second transistors include drains that are connected to form a common drain.

12. The programmable control switching device of claim 9 wherein said programmable and erasable memory cell is a FLASH-EPROM cell.

13. The programmable control switching device of claim 9 wherein said programmable and erasable memory cell is an EEPROM cell.

14. The programmable control switching device of claim 9 further comprising:
    a circuit having an input terminal, an output terminal, and two electrical paths between the terminals, the first path including the first transistor and the second path including the second transistor, the control node controlling which of the paths is conducting.

15. The programmable control switching device of claim 14 wherein:
    the input terminal includes first and second input terminals; and
    the drains of the first and second transistors are connected to the output terminal of the circuit, the source of a first transistor is connected to the first input terminal of the circuit and the source of the second transistor is connected to the second input terminal of the circuit.

16. The programmable control switching device of claim 15 wherein one of the first and second input terminals is connected to a tristate signal such that the tristate signal is activated when the path to which it is connected is conducting and the tristate signal is deactivated when the path to which it is connected is not conducting.

17. The programmable control switching device of claim 14, further comprising:

an inverter included in one of the two electrical paths such that a signal at the output terminal is inverted from a signal at the input terminal when the path with the inverter is conducting and the output terminal signal is not inverted from the input terminal signal when the path without the inverter is conducting.

18. The programmable control switching device of claim 9 wherein the memory cell, control node, and first and second transistors are included in a logic circuit means for performing a first logical function when the first transistor is conducting and a second logical function when the second transistor is conducting.

19. The programmable control switching device of claim 18 wherein the logic circuit means has an input and an output and the first logical function is a DON'T CARE and the second logical function is a PASS-THROUGH.

20. The programmable control switching device of claim 18, wherein the logic circuit means has plural inputs and an output and the first logical function is a NOR function and the second logical function is an OR function.

21. A programmable control switching device, comprising
 a first transistor having a source, a gate, and a drain;
 a second transistor having a source, a gate, and a drain;
 a control node coupled to the gate of each of the transistors, such that when the control node is at a first voltage level the control node causes the first transistor to conduct and when the control node is at second voltage level the control node causes the second transistor to conduct; and
 a programmable and erasable memory cell having an output coupled to the control node, the output supplying the first and second voltage levels;
 wherein the first and second transistors share a unitary floating gate structure with said programmable and erasable cell such that the control node coincides with the unitary floating gate structure.

22. A programmable control switching device, comprising
 a first transistor having a source, a gate and a drain;
 a second transistor having a source, a gate, and a drain;
 a control node coupled to the gate of each of the transistors, such that when the control node is at a first voltage level the control node causes the first transistor to conduct and when the control node is at second voltage level the control node causes the second transistor to conduct; and
 a programmable and erasable memos cell having an output coupled to the control node, the output supplying the first and second voltage levels;
 wherein the source of the first transistor is functionally connected to a first voltage node and the source of the second transistor is functionally connected to a second voltage node, such that an output of the switching device is provided by the first voltage node when the first transistor is conducting and the output of the switching device is provided by the second voltage node when the second transistor is conducting.

23. The programmable control switching device of claim 22, further comprising:
 a NOR gate having a plurality of inputs and an output;
 an input signal connected to one of the NOR gate inputs;
 wherein the switching device output is connected to another one of the NOR gate inputs, such that when the input signal is low, the output of the NOR gate is controlled by the switching device output.

* * * * *

UNITED STATES PATENT AND TRADEMARK OFFICE
CERTIFICATE OF CORRECTION

PATENT NO. : 5,412,599
DATED : May 2, 1995
INVENTOR(S) : Vincenzo Daniele, Mirella Benedetti and Nuccio Villa It is certified that error appears in the above-indentified patent and that said Letters Patent is hereby corrected as shown below:

In column 13, claim 5, line 47, after "transistors," please insert --each transistor--.

Signed and Sealed this

Fourteenth Day of November, 1995

BRUCE LEHMAN

Attest:

Attesting Officer

Commissioner of Patents and Trademarks